(12) United States Patent
Choo et al.

(10) Patent No.: US 10,580,822 B2
(45) Date of Patent: Mar. 3, 2020

(54) METHOD OF MAKING AND DEVICE HAVING A COMMON ELECTRODE FOR TRANSISTOR GATES AND CAPACITOR PLATES (71) Applicant: LG Display Co., Ltd., Seoul (KR)

(72) Inventors: Kyoseop Choo, Suwon-si (KR); Guensik Lee, Seoul (KR); Manhyeop Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/153,482

(22) Filed: Oct. 5, 2018

(65) Prior Publication Data

US 2019/0051694 A1    Feb. 14, 2019

Related U.S. Application Data

(63) Continuation of application No. 15/806,151, filed on Nov. 7, 2017, now Pat. No. 10,134,800.

(30) Foreign Application Priority Data

Nov. 9, 2016  (KR) .......................... 10-2016-0149010

(51) Int. Cl.
| | | |
|---|---|---|
| *H01L 27/12* | (2006.01) | |
| *H01L 27/146* | (2006.01) | |
| *H01L 29/417* | (2006.01) | |
| *H01L 29/45* | (2006.01) | |
| *H01L 29/786* | (2006.01) | |
| *H04N 3/14* | (2006.01) | |

(52) U.S. Cl.
CPC .... *H01L 27/14678* (2013.01); *H01L 27/1255* (2013.01); *H01L 29/41733* (2013.01); *H01L 29/458* (2013.01); *H01L 29/7869* (2013.01); *H01L 29/78633* (2013.01); *H04N 3/155* (2013.01)

(58) Field of Classification Search
CPC ............. H01L 27/3276; H01L 27/3262; H01L 27/124; H01L 27/3248
See application file for complete search history.

(56) References Cited

U.S. PATENT DOCUMENTS

| | | | | |
|---|---|---|---|---|
| 9,299,949 | B2 * | 3/2016 | Hwang | ............... H01L 51/5203 |
| 9,576,542 | B1 * | 2/2017 | Pollack | ................ G09G 3/3648 |
| 2002/0024097 | A1 * | 2/2002 | Joo | ................... H01L 27/14609 257/359 |
| 2011/0266543 | A1 * | 11/2011 | Moriwaki | ........... G02F 1/13624 257/59 |
| 2016/0268320 | A1 * | 9/2016 | Long | ..................... H01L 27/124 |
| 2017/0084641 | A1 * | 3/2017 | Lin | ..................... H01L 27/1251 |
| 2017/0141349 | A1 * | 5/2017 | Kwak | ..................... H01L 51/56 |
| 2017/0194405 | A1 * | 7/2017 | Tang | .................... H01L 27/3258 |

FOREIGN PATENT DOCUMENTS

KR    10-2008-0047923 A    5/2008

\* cited by examiner

*Primary Examiner* — Jaehwan Oh (74) *Attorney, Agent, or Firm* — Seed IP Law Group LLP (57) ABSTRACT

Disclosed herein is a circuit comprising a first thin film transistor (TFT) and storage capacitor having a first electrode and a second electrode configured to face to each other. A second TFT is coupled to the capacitor, wherein a first gate electrode of the first TFT, a first electrode of the storage capacitor and a second gate electrode of the second TFT are integrally formed.

16 Claims, 9 Drawing Sheets

FIG. 1

(RELATED ART)

FIG. 2

(RELATED ART)

METHOD OF MAKING AND DEVICE HAVING A COMMON ELECTRODE FOR TRANSISTOR GATES AND CAPACITOR PLATES

CROSS-REFERENCE TO RELATED APPLICATION

This disclosure claims the benefit of priority under 35 U.S.C. § 119(a) to Republic of Korea Patent Application No. 10-2016-0149010 filed on Nov. 9, 2016, the entire contents of which is incorporated herein by reference for all purposes as if fully set forth herein.

BACKGROUND

Technical Field

This disclosure relates to a photo sensor and a display device having the same, in particular to a photo sensor using thin film transistors and a display device having the same.

Description of the Related Art

A photo sensor is a device that stores amount of charge according to intensity of light as information and outputs the stored information according to an external control signal. The photo sensor is widely used as an image recognition device for reading characters and pictures in a X-ray detector, a scanner, a digital copier, a fingerprint recognition system, a facsimile or the like.

Hereinafter, a related art photo sensor (hereinafter, referred to as a "photo sensor") using thin film transistors will be described with reference to FIG. 1 and FIG. 2.

Figure 1:
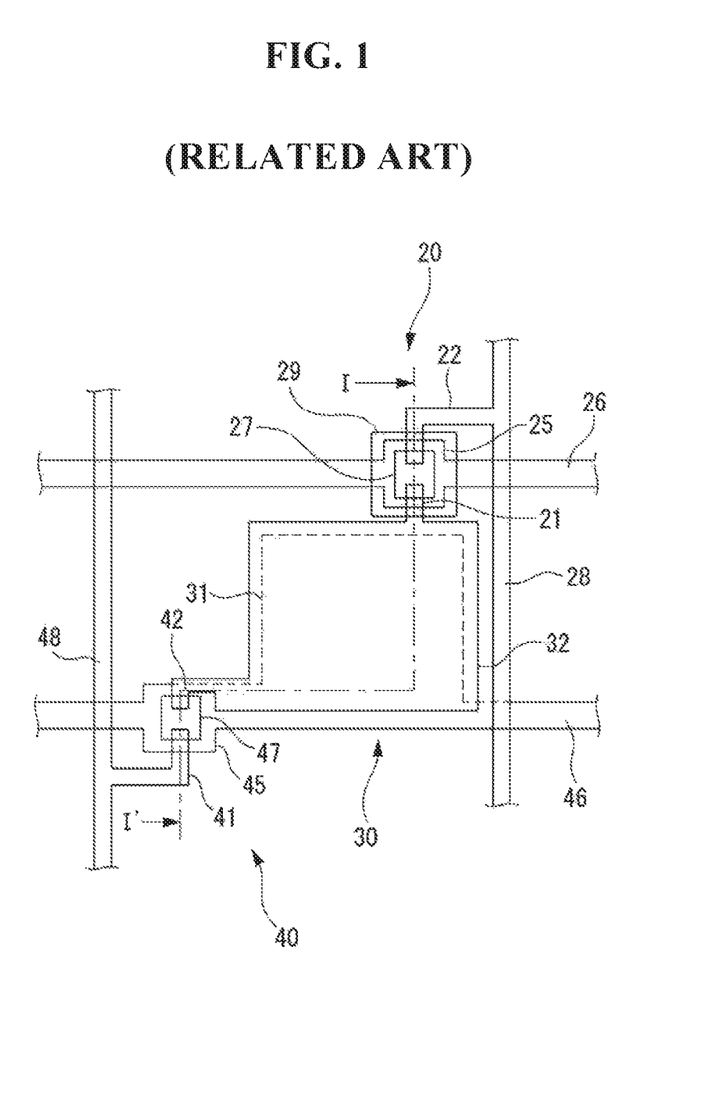
FIG. 1 is a plan view showing an example of a related art photo sensor.
Figure 2:
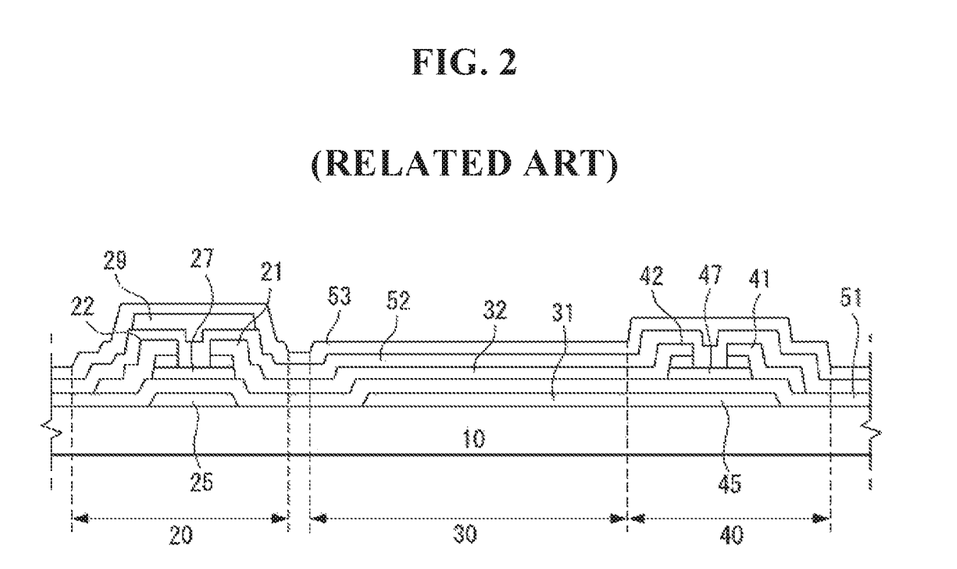
FIG. 2 is a cross-sectional view taken along line I-I' of FIG. 1.

FIG. 1 is a plan view showing an example of a related art photo sensor, and FIG. 2 is a cross-sectional view taken along line I-I' of FIG. 1.

Referring to FIGS. 1 and 2, the photo sensor includes a switching thin film transistor (TFT) 20, a storage capacitor 30, and a sensor TFT 40.

The sensor TFT 40 includes a sensor drain electrode 41, a sensor source electrode 42, a sensor gate electrode 45, and a sensor semiconductor layer 47. The sensor gate electrode 45 is formed on the substrate 10, and the sensor semiconductor layer 47 is insulated from the sensor gate electrode 45 by a first insulating layer 51 covering the sensor gate electrode 45. The sensor drain electrode 41 and the sensor source electrode 42 are arranged to be in contact with the sensor semiconductor layer 47. The sensor drain electrode 41 is connected to a sensor drain wire 48, and the sensor gate electrode 45 is connected to a sensor gate line 46.

The switching TFT 20 includes a switching drain electrode 21, a switching source electrode 22, a switching gate electrode 25, and a switch semiconductor layer 27. The switching gate electrode 25 is formed on the substrate 10, and the switch semiconductor layer 27 is insulated from the switching gate electrode 25 by the first insulating layer 51 covering the switching gate electrode 25. The switching drain electrode 21 and the switching source electrode 22 are arranged to be in contact with the switch semiconductor layer 27. The switching source electrode 22 is connected to a lead-out wire 28, and the switching gate electrode 25 is connected to a switching gate line 26. The lead-out wire 28 functions as a data line through which charges stored in the storage capacitor 30 are output.

The storage capacitor 30 includes a first capacitor electrode 31 and a second capacitor electrode 32 that are insulated from each other by a first insulating layer 51. The first capacitor electrode 31 is formed integrally with the sensor gate electrode 45 and separated from the switching gate electrode 25 as shown in FIG. 2. The second capacitor electrode 32 is formed integrally with the sensor source electrode 42 and the switching drain electrode 21.

A second insulating layer 52 is stacked on the sensor TFT 40, the storage capacitor 30, and the switching TFT 20 to cover them. A light shielding film 29 is formed on the second insulating layer 52 in the region where the switching TFT 20 is formed. A protective film 53 is disposed on the second insulating layer 52 on which the light shielding film 29 is formed so as to cover the light-shielding film 29.

The sensor TFT 40 senses an input light to generate a current, and charges are accumulated in the storage capacitor 30 by the current generated by the sensor TFT 40. The stored charges are output to the lead-out wire 28 by a switching operation of the switching TFT 20.

In the above-described photo sensor, the first capacitor electrode 31 and the sensor gate electrode 45 are formed integrally, and the switching gate electrode 25 is formed to be separated from the first capacitor electrode 31 and the sensor gate electrode 45. In such a structure, since the switching gate line 26 have to be formed separately from the first capacitor electrode 31 and the sensor gate line 46. Therefore, there are some problems in that a space utilization is reduced, thereby reducing an integration of the photo sensor as well as an aperture ratio when the photo sensor is applied to a display device.

BRIEF SUMMARY

A circuit according to the disclosure includes comprises a first thin film transistor (TFT); a storage capacitor having a first electrode and a second electrode configured to face to each other, and storing electric energy; and a second TFT coupled to capacitor, wherein a first gate electrode of the first TFT, a first electrode of the storage capacitor and a second gate electrode of the second TFT are integrally formed.

The first TFT is a bottom gate type TFT in which the first gate electrode of the first TFT is disposed below a first semiconductor layer of the first TFT, and the second TFT is a top gate type TFT in which the second gate electrode of the second TFT is disposed above a second semiconductor layer of the first TFT.

The first semiconductor layer of the first TFT is made of amorphous silicon (a-Si), and the second semiconductor layer of the second TFT is made of polysilicon (p-Si).

The second TFT includes the second semiconductor layer disposed on a substrate; the second gate electrode disposed on a gate insulation film covering the second semiconductor layer to overlap the second semiconductor layer; a second drain electrode disposed on an interlayer insulation film covering the second gate electrode and having a first contact hole and a second contact hole which exposes both ends of the second semiconductor layer, respectively, and connected to one end of the second semiconductor layer through the first contact hole; and a second source electrode disposed on the interlayer insulation film, and connected to another end of the second semiconductor layer through the second contact hole.

The storage capacitor includes the first electrode disposed on the gate insulation film; and the second electrode opposite to the first electrode with the interlayer insulation film therebetween.

The first TFT includes the first gate electrode disposed on the gate insulation film; the first semiconductor layer disposed on the interlayer insulation film covering the first gate electrode to overlap the first gate electrode; a first drain electrode disposed on the interlayer insulation film having a third contact hole, and having one end connected to the first gate electrode exposed through the third contact hole and another end connected to a portion of the first semiconductor layer; and a first source electrode disposed on the interlayer insulation film, and having one end connected to another portion of the first semiconductor layer and another end connected to the second electrode of the storage capacitor.

The first gate electrode is integral with the first electrode of the storage capacitor to be extended from the first electrode, and the first source electrode is integral with the second electrode of the storage capacitor and the second drain electrode to be extended from the second electrode.

A display device according to the disclosure comprises a plurality of gate lines and a plurality of data lines crossing over each other; and pixels disposed in regions defined by crossing of the plurality of gate lines and data lines; each of the pixels includes: display elements configured to display an image; and at TFT connected to at least one of the plurality of gate lines.

An electroluminescence display device according to the disclosure comprises a plurality of gate lines and a plurality of data lines crossing over each other; and pixels disposed in regions defined by crossing of the plurality of gate lines and data lines; each of the pixels includes: an organic light emitting diode; a cell driving unit configured to control amount of current flowing through the organic light emitting diode; and the TFT sensor connected to at least one of the plurality of gate lines.

The electroluminescence display device further comprises a lead-out wire connected to a source electrode of the second TFT, and overlapped with the data line.

A liquid crystal display device according to the disclosure comprises a plurality of gate lines and a plurality of data lines crossing over each other; and pixels disposed in regions defined by crossing of the plurality of gate lines and data lines; each of the pixels includes: a pixel electrode configured to receive a data voltage through a third TFT connected to the gate line and the data line; a common electrode configured to receive a common voltage, and opposite to the pixel electrode to generate electric field by voltage difference between the data voltage and the common voltage; and the TFT of claim 1 connected to at least one of the plurality of gate lines.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Hereinafter, embodiments of this disclosure are described in detail with reference to the accompanying drawings. In the specification, the same reference numerals denote the same elements. In the following description, a detailed description of the known functions and constitutions will be omitted if it is deemed to obscure the embodiments of the disclosure. Furthermore, the names of elements used in the following description have been selected by taking into consideration only the ease of writing this specification and may be different from the names of actual parts.

Hereinafter, a photo sensor according to an embodiment of the disclosure will be described with reference to FIGS. 3 to 5. The inventive features taught herein apply also to a combination of transistors having gates, sources and drains with capacitors coupled to various nodes and are not limited to photo sensors. Accordingly, the photo sensor is just one embodiment and other embodiments can carry out the claimed features.

Figure 3:
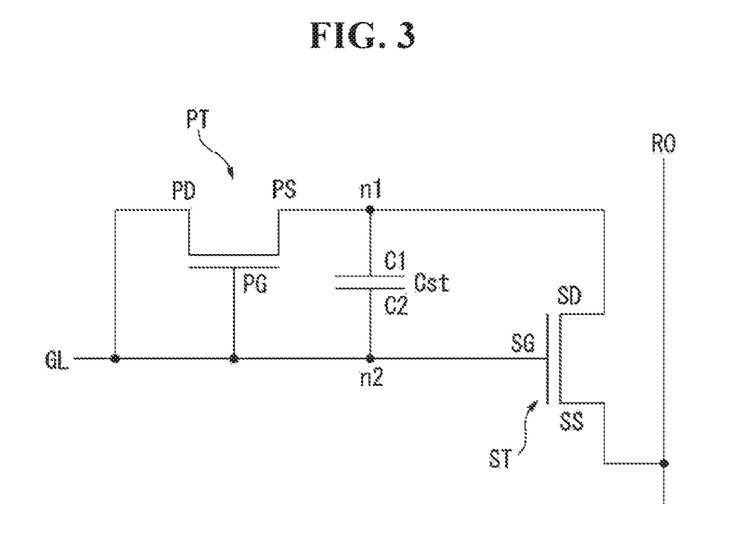
FIG. 3 is an equivalent circuit diagram showing a photo sensor according to an embodiment of the disclosure.

FIG. 3 is an equivalent circuit diagram showing a photo sensor according to an embodiment of the disclosure. FIG. 4 is a plan view showing the equivalent circuit diagram shown in FIG. 3, and FIG. 5 is a cross-sectional view taken along line I-I' of FIG. 4.

Referring to FIG. 3, a photo sensor according to an embodiment of the disclosure includes a photo TFT PT, a storage capacitor Cst, and a switching TFT ST.

The photo TFT PT includes a photo source electrode PS connected to a first node n1, a photo gate electrode PG connected to a second node n2 which is connected to a gate line GL, a photo drain electrode PD connected to the second node n2 and a photo semiconductor layer Al for converting light energy into electric energy between the photo drain electrode PD and the photo source electrode PS. The gate line GL, the photo gate electrode PG, the photo drain electrode PD, and the photo source electrode PS may be formed using a metal material having good conductivity. The photo semiconductor layer Al may be formed using amorphous silicon (a-Si) having a large light absorption coefficient over an entire wavelength range as well as a high photoelectric conversion efficiency.

The storage capacitor Cst includes a first capacitor electrode C1 connected to the first node n1 and a second capacitor electrode C2 connected to the second node n2 which is connected to the gate line GL. The second capacitor electrode C2 is opposite to the first capacitor electrode C1 with an insulating film therebetween. The first and second capacitor electrodes C1 and C2 may be formed using a metal material having good conductivity.

The switching TFT ST includes a switching gate electrode SG connected to the second node n2, a switching drain electrode SD connected to the first node n1, and a switching source electrode SS connected to a lead-out wire RO, and a switching semiconductor layer A2 for controlling the amount of current in accordance with a control signal supplied to the switching gate electrode SG through the gate line GL between the switching drain electrode SD and the switching source electrode SS. The switching gate electrode SG, the switching drain electrode SD, the switching source electrode SS, and the lead-out wire RO may be formed using a metal material having good conductivity. The switching semiconductor layer A2 may be formed using an oxide semiconductor which can be driven at a high speed and low power as compared with amorphous silicon and can obtain high efficiency with a small area. The switching semiconductor layer A2 may be formed using a polysilicon (p-Si) having no characteristic damage for a manufacturing process and good driving ability since the p-Si has excellent resistance to fire, water repellency, oxidation stability, low temperature stability and gas permeability.

Similar to the example just noted, the teachings here are provided with the photo sensor as just one of many possible embodiments. These teachings can be applied to any combination of transistors having gates, sources and drains with capacitors coupled to various nodes and are not limited to photo sensors.

Figure 4:
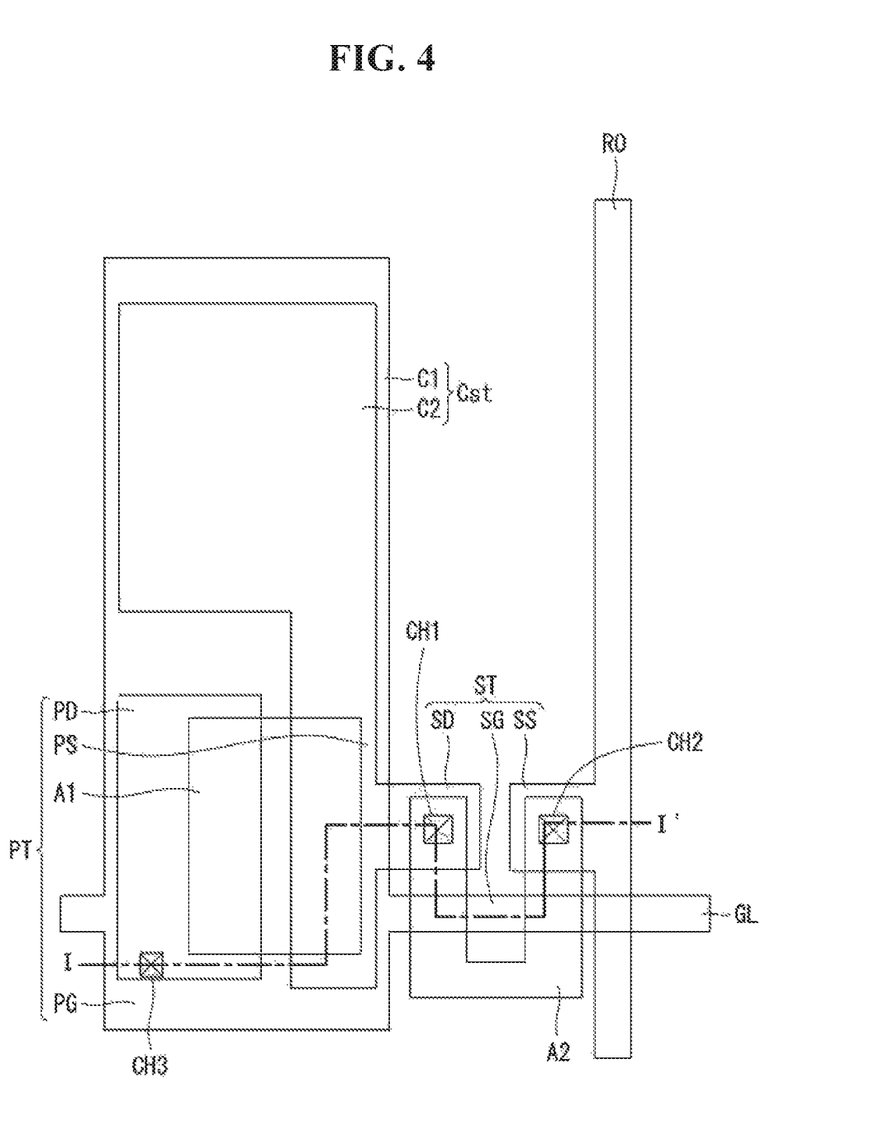
FIG. 4 is a plan view showing the equivalent circuit diagram shown in FIG. 3.
Figure 5:
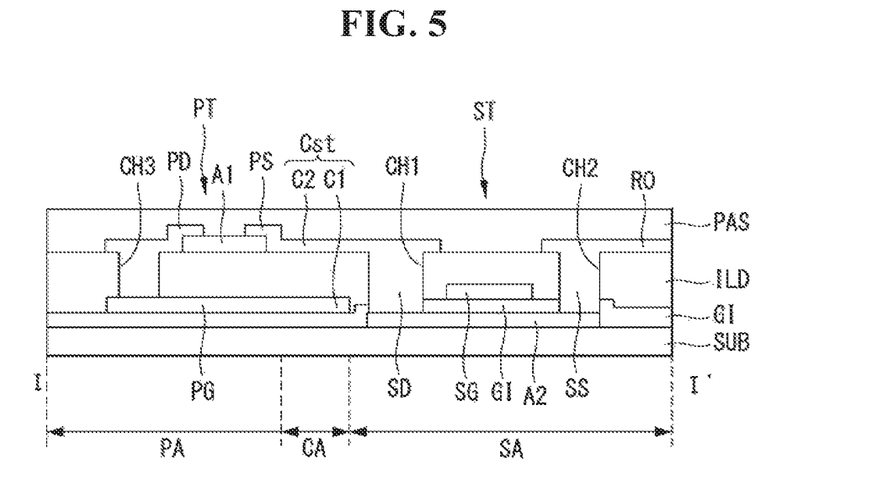
FIG. 5 is a cross-sectional view taken along line I-I' of FIG. 4.

Referring to FIGS. 4 and 5, the photo sensor of one embodiment of the disclosure includes the photo TFT PT, the storage capacitor Cst, and the switching TFT ST.

The switching TFT ST includes a switching semiconductor layer A2 disposed on a switching TFT area SA on a substrate SUB, a gate insulation film GI covering the switching semiconductor layer A2 on the substrate SUB on which the switching semiconductor layer A2 is disposed, a switching gate electrode SG disposed on the gate insulating film GI so as to overlap the switching semiconductor layer A2, an interlayer insulation film ILD which covers the gate electrode SG and has first and second contact holes CH1 and CH2 for exposing both ends of the switching semiconductor layer A2, respectively, a switching drain electrode SD disposed on the interlayer insulation film ILD to be connected to one end of the switching semiconductor layer A2 exposed through the first contact hole CH1, and a switching source electrode SS disposed on the interlayer insulation film ILD to be connected to the other end of the switching semiconductor layer A2 exposed through the second contact hole CH2. The switching source electrode SS may be connected to the lead-out wire RO which is connected to an external processor.

The storage capacitor Cst includes a first capacitor electrode C1 disposed in a capacitor area CA on the gate insulating film GI, and a second capacitor electrode C2 opposite to the first capacitor electrode C1 with the interlayer insulation film ILD therebetween. The first capacitor electrode C1 may be integral with the switching gate electrode SG and the gate line GL. Therefore, in one embodiment, the interlayer insulation film ILD acts as the capacitor insulation located between the first capacitor electrode C1 and the second capacitor electrode C2.

The photo TFT PT includes a photo gate electrode PG disposed in a photo area PA on the gate insulating film GI, a photo semiconductor layer A1 disposed on the first interlayer insulation film ILD covering the photo gate electrode PG to overlap the photo gate electrode PG, a photo drain electrode PD disposed on the interlayer insulation film ILD having a third contact hole CH3 exposing a portion of the photo gate electrode PG, and having one end connected to the photo gate electrode PG exposed through the third contact hole CH3 and another end connected to a portion of the photo semiconductor layer A1, and a photo source electrode PS disposed on the interlayer insulation film ILD and having one end connected to another portion of the photo semiconductor layer A1 and another end connected to the second capacitor electrode C2 of the storage capacitor Cst.

As shown in FIG. 5, in one embodiment, the thickness of the gate insulation of the photo TFT PT is thicker than the thickness of the gate insulation of the switching TFT ST.

The photo gate electrode PG may be integral with the first capacitor electrode C1 of the storage capacitor Cst and extend from the first capacitor electrode C1. In addition, the photo source electrode PS may be integral with the second capacitor electrode C2 and the switching drain electrode SD, and extend from the second capacitor electrode C2. Namely, the first gate electrode of the photo TFT, PT, the first electrode of the storage capacitor C1 and the second gate electrode of the switching TFT ST are integrally formed. In one embodiment, they are formed at the same time, from the same layer as a single continuous layer and member.

In the photo sensor according to one embodiment of the disclosure having the above-described construction, the photo TFT PT senses an input light to generate a current, and the storage capacitor Cst stores charges corresponding to the current generated by the photo TFT PT. The charges in the storage capacitor Cst are output to the lead-out wire RO by a switching operation of the switching TFT ST. That is, when an object such as a finger, a pen, or a pupil gets accessed or contacted to the photo sensor, the amount of light incident on the photo sensor is changed, and the change in the amount of light is received through the lead-out wire RO. It becomes possible to recognize the object to be accessed or contacted. Therefore, the photo sensor according to one embodiment of the disclosure can be applied to various display devices and biometric devices for touch recognition, fingerprint recognition, and iris recognition.

In the photo sensor according to one embodiment of the disclosure, the photo gate electrode PG of the photo TFT PT and the first capacitor electrode C1 of the storage capacitor Cst are integral with the switching gate electrode SG of the switching TFT ST without being separated from the switching gate electrode SG. Accordingly, it is possible that not only the integration can be increased but also an aperture ratio of a display device can be improved if the photo sensor is applied to the display device.

Hereinafter, an example in which the photo sensor according to the embodiment of the disclosure is applied to a display device will be described. A display device that has pixels which output light may also make use of the inventive features taught herein. These teaching can apply to a device that has any combination of transistors having gates, sources and drains with capacitors coupled to various nodes.

Figure 6:
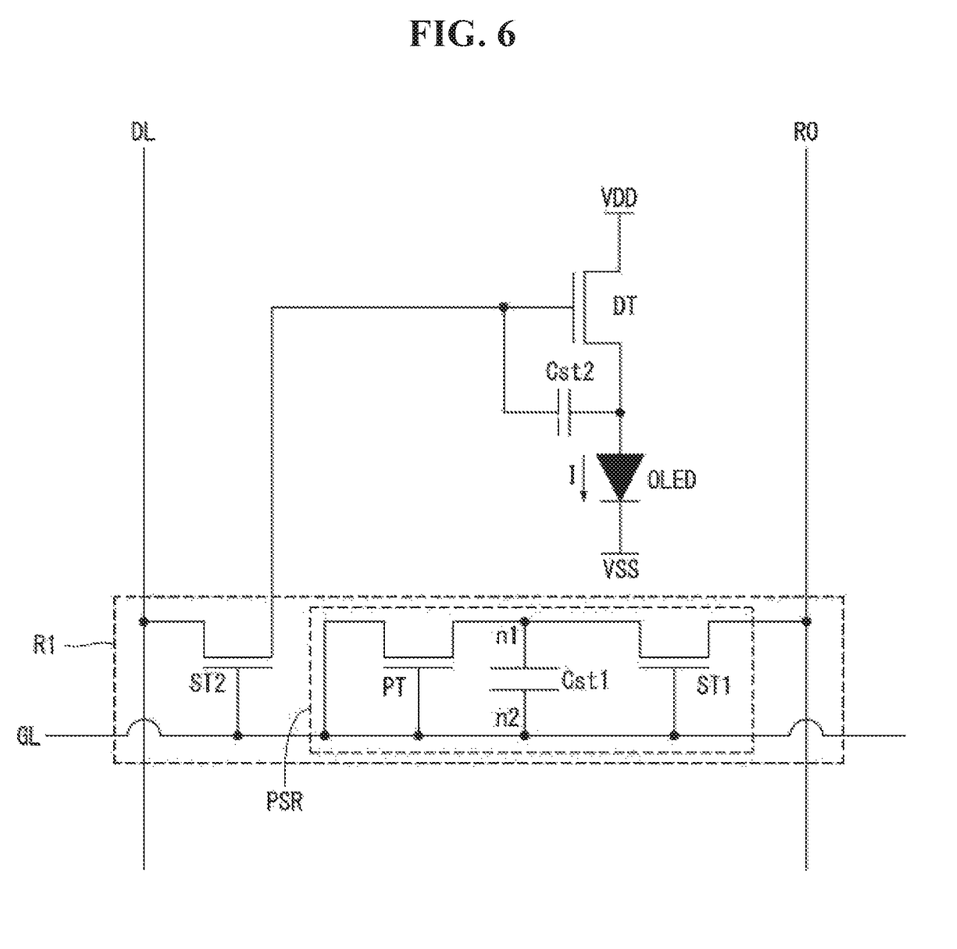
FIG. 6 is an equivalent circuit diagram showing one pixel region of an electroluminescence display device to which the photo sensor according to the embodiment of FIG. 3 is applied.
Figure 7:
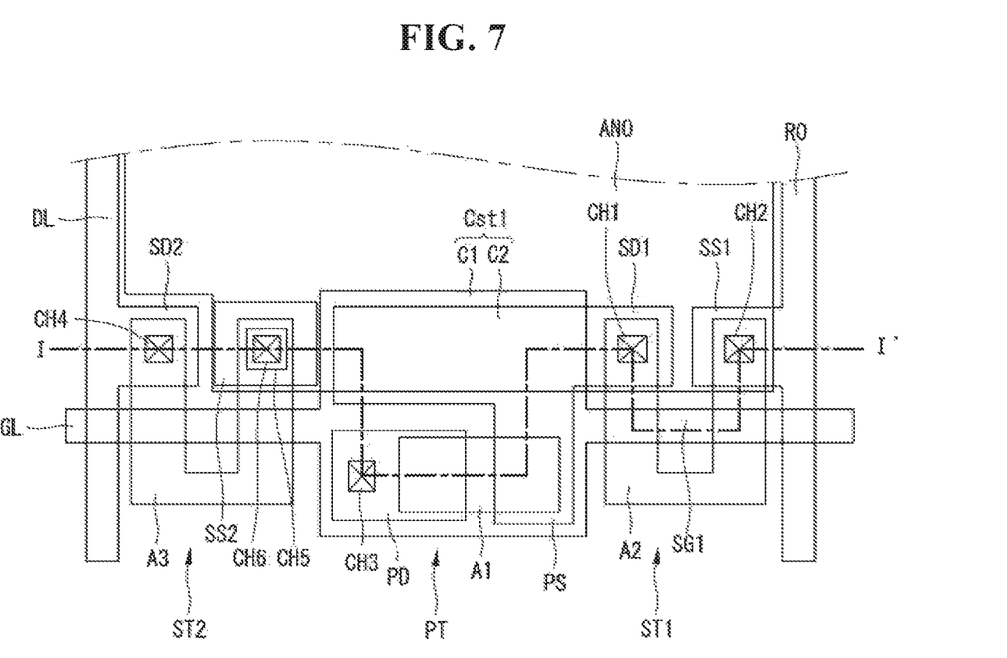
FIG. 7 is a plan view showing an example of a region R1 of the equivalent circuit diagram shown in FIG. 6.
Figure 8:
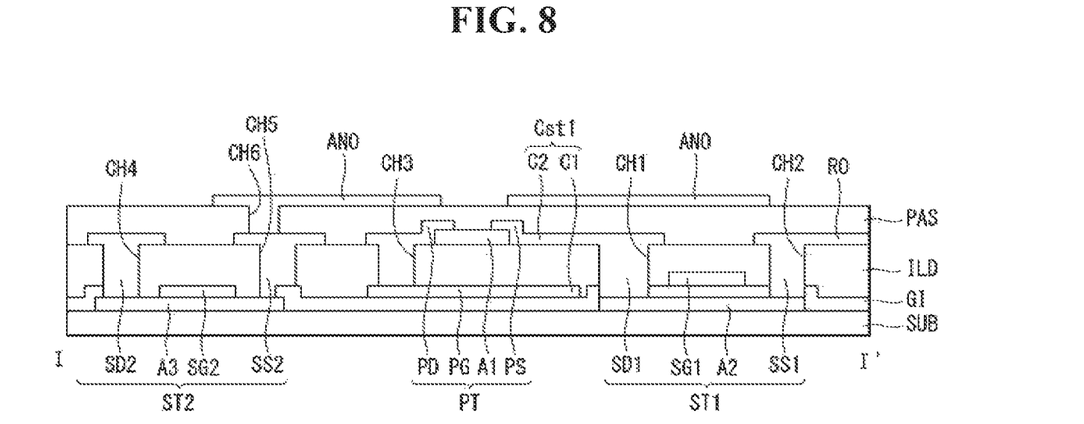
FIG. 8 is a cross-sectional view taken along the line I-I' of FIG. 7.

First, an electroluminescence display device is provided; it may or may not have a photo sensor therein, according to various embodiments Turning to one example with reference to FIGS. 6 to 8, a pixel region of the electroluminescence display device to which the photo sensor according to the embodiment of the disclosure is applied will be mainly described in order to prevent the essence of the disclosure from being obscure and to prevent the description from becoming complicated. In examples of FIGS. 6 to 8, the construction of the pixel region other than the photo sensor is not limited to the illustrated example, and all of the structures of the pixel region filed prior to the filing date of the disclosure should be understood as being included in the disclosure.

FIG. 6 is an equivalent circuit diagram showing one pixel region of an electroluminescence display device to which the photo sensor according to the embodiment of FIG. 3 is applied. FIG. 7 is a plan view showing an example of a region R1 of the equivalent circuit diagram shown in FIG. 6, and FIG. 8 is a cross-sectional view taken along the line I-I' of FIG. 7.

An electroluminescence display device including a photo sensor according to the embodiment of the disclosure includes a plurality of data lines DL and a plurality of gate lines GL crossing over each other, and a plurality of pixels arranged in a matrix form in the crossing regions. In some embodiments, each pixel includes a photo sensor PSR, a cell driving unit, and an organic light emitting diode OLED, while in other embodiments, each pixel only includes at least two transistors, one or more capacitors and an OLED.

In the embodiment with a photo sensor, the photo sensor PSR includes a photo TFT PT, a first storage capacitor Cst1, and a first switching TFT ST1.

The photo TFT PT includes a photo source electrode PS connected to a first node n1, a photo gate electrode PG connected to a second node n2 which is connected to a gate line GL, a photo drain electrode PD connected to the second node n2, and a photo semiconductor layer A1 for converting light energy into electric energy between the photo drain electrode PD and the photo source electrode PS. The gate line GL, the photo gate electrode PG, the photo drain electrode PD, and the photo source electrode PS may be formed using a metal material having good conductivity. The photo semiconductor layer A1 may be formed using amorphous silicon (a-Si) having a large light absorption coefficient over an entire wavelength range as well as a high photoelectric conversion efficiency.

The first storage capacitor Cst1 includes a first capacitor electrode C1 is connected to the first node C1 and a second capacitor electrode C2 connected to the second node n2 which is connected to the gate line GL. The second capacitor electrode C2 is opposite to the first capacitor electrode C1 with an insulating film therebetween. The first and second capacitor electrodes C1 and C2 may be formed using a metal material having good conductivity.

The first switching TFT ST includes a first switching gate electrode SG1 connected to the second node n2, a first switching drain electrode SD1 connected to the first node n1, a first switching source electrode SS1 connected to a lead-out wire RO, and a first switching semiconductor layer A2 for controlling the amount of current in accordance with a control signal supplied to the first switching gate electrode SG1 through the gate line GL between the first switching drain electrode SD1 and the first switching source electrode SS1. The first switching gate electrode SG1, the first switching drain electrode SD1, the first switching source electrode SS1, and the lead-out wire RO may be formed using a metal material having good conductivity. The first switching semiconductor layer A2 may be formed using an oxide semiconductor which can be driven at a high speed and low power as compared with amorphous silicon and can obtain high efficiency with a small area. The first switching semiconductor layer A2 may be formed using a polysilicon (p-Si) having no characteristic damage for a manufacturing process and good driving ability since the p-Si has excellent resistance to fire, water repellency, oxidation stability, low temperature stability and gas permeability.

The cell driving unit includes a driving TFT DT for controlling the amount of current flowing through the organic light emitting diode OLED, at least one second switching TFT ST2, and at least one second storage capacitor Cst2. In the following description, the cell driving unit includes a 2T1C construction (two TFTs and one storage capacitor) having one driving TFT DT, one second switching TFT ST2, and one second storage capacitor Cst2 However, the disclosure is not limited thereto, and the cell driving unit may use all kinds of existing structures including 3T1C, 4T2C and so on.

The second switching TFT ST2 is turned on in response to a scan signal from the gate line GL, thereby applying a data voltage from the data line DL to one electrode of the second storage capacitor Cst2.

The driving TFT DT controls the amount of current supplied to the organic light emitting diode OLED according to the magnitude of the voltage charged in the second storage capacitor Cst2 to adjust the amount of light emitted from the organic light emitting diode OLED. The amount of light emitted from the organic light emitting diode OLED is proportional to the amount of current supplied from the driving TFT DT.

Each pixel is connected to a high potential power source VDD and a low potential power source VSS and receives a high potential voltage and a low potential voltage from a power generation unit (not shown).

The second switching TFT ST2 and the driving TFT DT may be implemented as a p-type or an n-type. Further, the semiconductor layer of the TFTs constituting each pixel may include amorphous silicon, polysilicon, or an oxide. The organic light emitting diode OLED includes an anode electrode, a cathode electrode, and an organic light emitting layer interposed between the anode electrode and the cathode electrode. The anode electrode is connected to the driving TFT DT. The organic light emitting layer may include an emission layer (EML), a hole injection layer (HIL) and a hole transport layer (HTL) disposed at one surface of the emission layer (EML), and an electron transport layer (ETL) and an electron injection layer (EIL) disposed at the other surface of the emission layer (EML).

In the electroluminescence display device according to the embodiment of the disclosure, the second switching TFT ST2 is turned on when a scan pulse is supplied to the gate line GL, and supplies a data signal supplied to the data line DL to the second storage capacitor Cst2 and the gate electrode of the driving TFT DT. The driving TFT DT controls the amount of light emitted from the organic light emitting diode OLED by controlling a current I supplied from the high potential power source VDD to the organic light emitting diode OLED in response to the data signal supplied to the gate electrode. Even if the first switching thin film transistor ST1 is turned off, the driving TFT DT supplies a constant current I by the voltage charged in the second storage capacitor Cst2. Accordingly, it is possible to maintain the emission of the organic light emitting diode OLED until the data signal of a next frame is supplied.

The photo TFT PT of the photo sensor PSR senses an input light to generate a current, and the charges are accumulated to the first storage capacitor Cst1 by the current generated by the photo TFT PT. The accumulated charges are output to the lead-out wire RO by the switching operation of the first switching TFT (ST1). That is, when an object such as a finger, a pen, or a pupil gets accessed or contacted to the photo sensor, the amount of light incident on the photo sensor is changed, and the change in the amount of light is received through the lead-out wire RO. It becomes possible to recognize the object to be accessed or contacted.

Referring to FIGS. 7 and 8, a region R1 of the electroluminescence display device of the disclosure includes the photo TFT PT of the photo sensor PSR, the first storage capacitor Cst1, and the first switching TFT ST1 and the second switching TFT ST2 of the cell driving unit.

The first switching TFT ST1 of the photo sensor PSR includes a first switching semiconductor layer A2 disposed on the substrate SUB, a first switching gate electrode SG1 disposed on a gate insulating film GI covering the first switching semiconductor layer A2 so as to overlap the first switching semiconductor layer A2, a first switching drain electrode SD1 disposed on an interlayer insulation film ILD to be connected to one end of the first switching semiconductor layer A2 exposed through the first contact hole CH1, and a first switching source electrode SS1 disposed on the interlayer insulation film ILD to be connected to the other end of the first switching semiconductor layer A2 exposed through the second contact hole CH2 of the interlayer insulation film ILD. The first switching source electrode SS1 may be connected to the lead-out wire RO which is connected to an external processor.

The photo TFT PT of the photo sensor PSR includes a photo gate electrode PG disposed in a photo area PA on the gate insulating film GI, a photo semiconductor layer A1 disposed on the interlayer insulation film ILD covering the photo gate electrode PG to overlap the photo gate electrode PG, a photo drain electrode PD disposed on the interlayer insulation film ILD having a third contact hole CH3 exposing a portion of the photo gate electrode PG, and having one end connected to the photo gate electrode PG exposed through the third contact hole CH3 and another end connected to a portion of the photo semiconductor layer A1, and a photo source electrode PS disposed on the interlayer insulation film ILD and having one end connected to another portion of the photo semiconductor layer A1 and another end connected to the second capacitor electrode C2 of the first storage capacitor Cst1.

The photo gate electrode PG may be integral with the first capacitor electrode C1 of the storage capacitor Cst and extend from the first capacitor electrode C1. In addition, the photo source electrode PS may be integral with the second capacitor electrode C2, and extend from the second capacitor electrode C2 of the first storage capacitor Cst1.

The first storage capacitor Cst1 of the photo sensor PSR includes a first capacitor electrode C1 disposed in a capacitor area on the gate insulating film GI, and a second capacitor electrode C2 opposite to the first capacitor electrode C1 with the interlayer insulation film ILD therebetween. The first capacitor electrode C1 may be integral with the photo gate electrode PG and the gate line GL.

The second switching TFT ST2 of the cell driving unit includes a second switching semiconductor layer A3 disposed on the substrate SUB, a second switching gate electrode SG2 disposed on the gate insulating film GI covering the second switching semiconductor layer A3 so as to overlap the second switching semiconductor layer A3, a second switching drain electrode SD2 disposed on the interlayer insulation film ILD which covers the second gate electrode SG2 and has fourth and fifth contact holes CH4 and CH5 for exposing both ends of the second switching semiconductor layer A3 to be connected to one end of the second switching semiconductor layer A3 exposed through the fourth contact hole CH4, a second switching source electrode SS2 disposed on the interlayer insulation film ILD to be connected to the other end of the second switching semiconductor layer A3 exposed through the fifth contact hole CH5. The anode electrode ANO of the organic light emitting diode OLED is disposed on a passivation film PAS covering the second switching source electrode SS2 and the second switching drain electrode SD2, and is connected to the second switching source electrode SS2 exposed through a sixth contact hole CH6 of the passivation film PAS.

Next, another example of the electroluminescence display device according to the embodiment of FIG. 6 will be described with reference to FIGS. 9 and 10.

Figure 9:
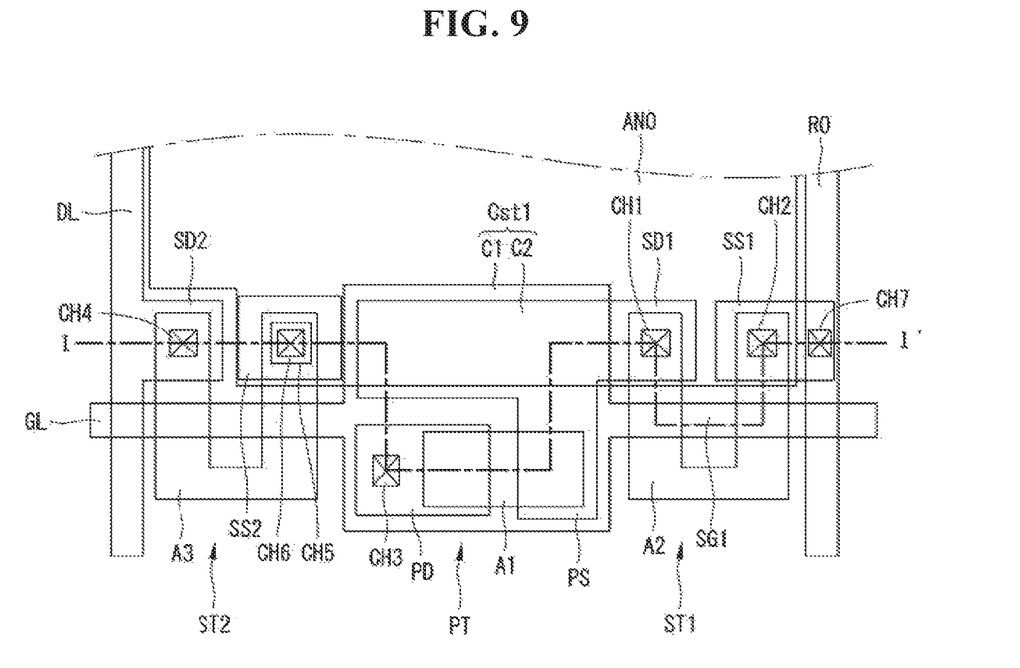
FIG. 9 is a plan view showing another example of the region R1 of the equivalent circuit diagram shown in FIG. 6.
Figure 10:
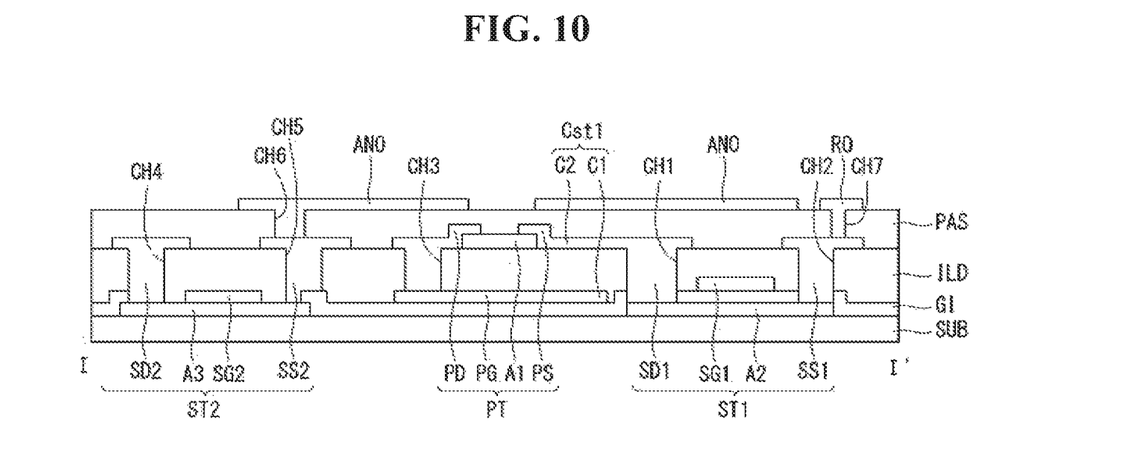
FIG. 10 is a cross-sectional view taken along line I-I' of FIG. 9.

FIG. 9 is a plan view showing another example of the region R1 of the equivalent circuit diagram shown in FIG. 6, and FIG. 10 is a cross-sectional view taken along line I-I' of FIG. 9.

Referring to 9 and 10, the another example of the electroluminescence display device is the same as the one example shown in FIGS. 7 and 8, excepting that the lead-out wire RO of the another example of the electroluminescence display device is disposed on the passivation film PAS, and is connected to the first switching source electrode SS1 through a seventh contact hole CH7 which penetrates through the passivation film PAS. Therefore, further explanation will be omitted in order to avoid redundant description.

In the electroluminescence display device according to the embodiment shown FIGS. 9 and 10, the data line DL is disposed on the interlayer insulation film ILD, the lead-out wire RO is disposed on the data line DL so that the lead-out line RO and the data line DL are disposed on different layers. Accordingly, if the lead-out wire RO and the data line DL are disposed so as to overlap with each other, it is possible to increase an aperture ratio as compared with the electroluminescence display device according to the embodiment shown in FIGS. 7 and 8.

Next, a liquid crystal display device to which a photo sensor according to an embodiment of the disclosure is applied will be described with reference to FIGS. 11 to 13.

Figure 11:
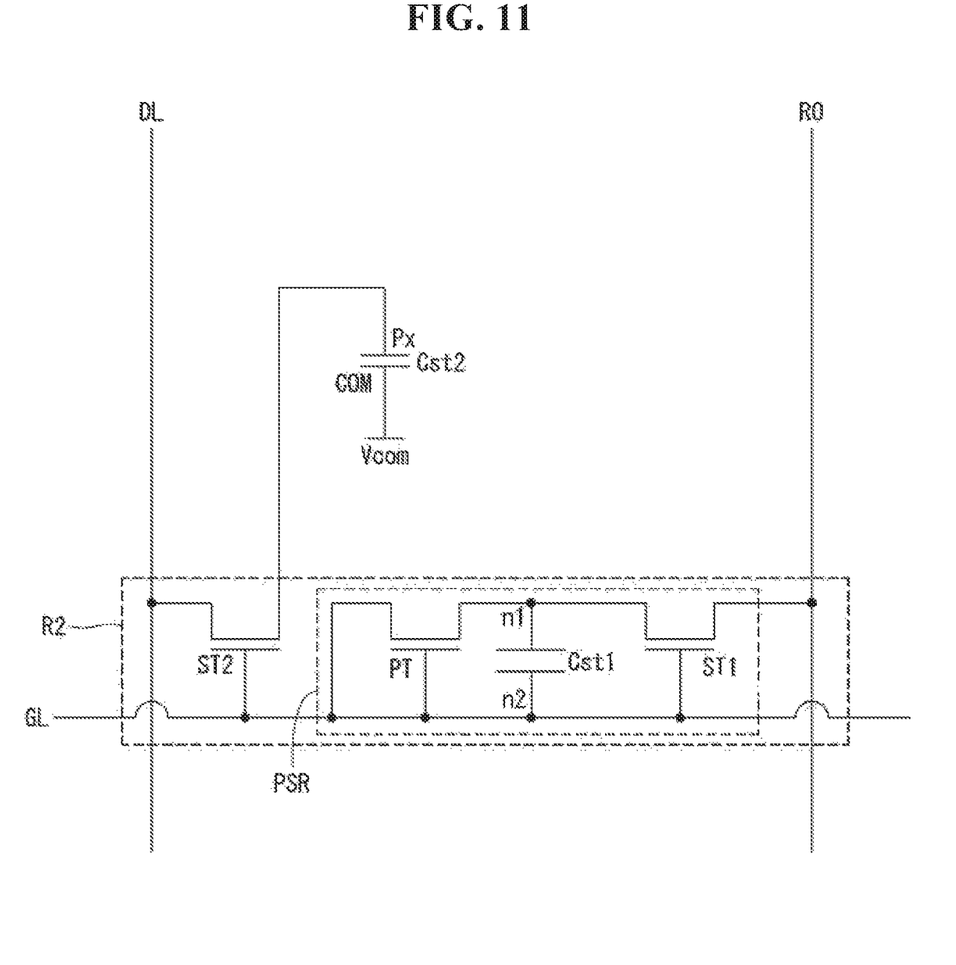
FIG. 11 is an equivalent circuit diagram showing one pixel region of a liquid crystal display device to which the photo sensor according to the embodiment of FIG. 3 is applied.
Figure 12:
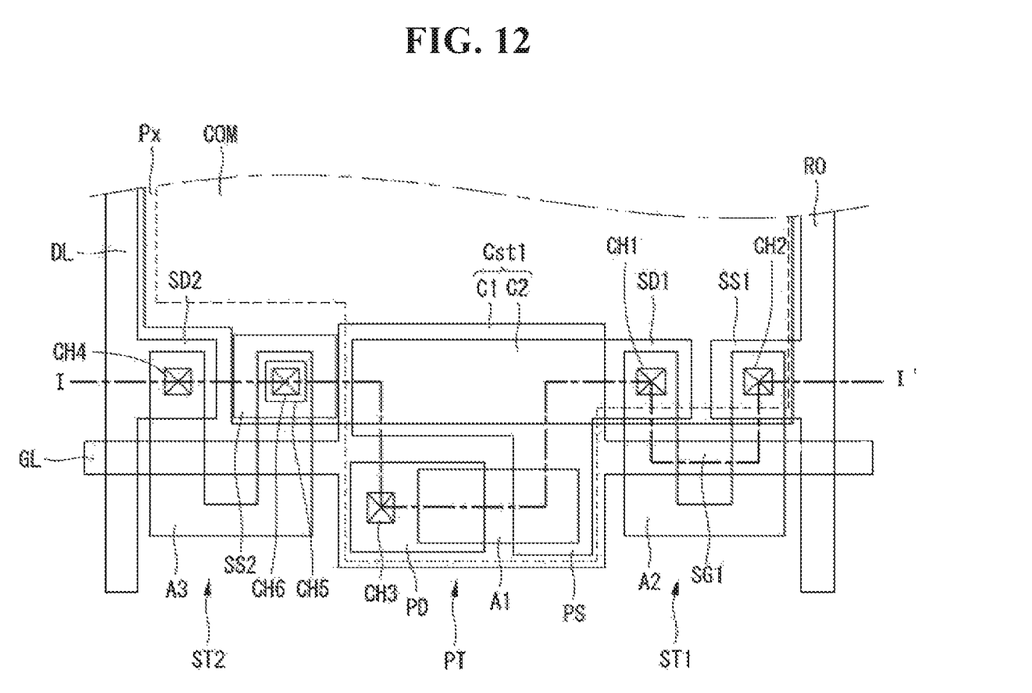
FIG. 12 is a plan view showing an area R2 of the equivalent circuit diagram shown in FIG. 11.
Figure 13:
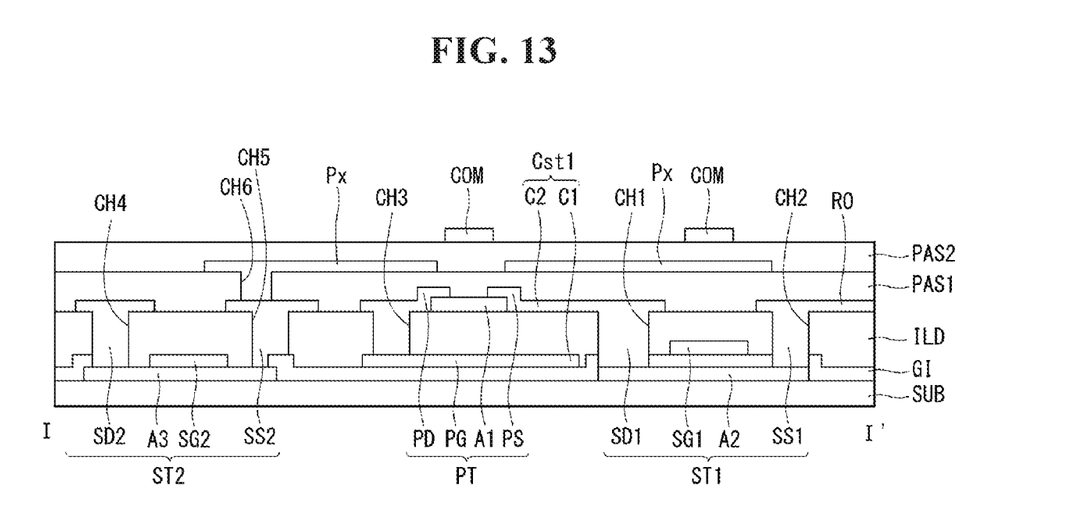
FIG. 13 is a cross-sectional view taken along line I-I' of FIG. 12.

In FIGS. 11 to 13, a pixel region of the liquid crystal display device to which the photo sensor according to one of the embodiments of the disclosure is applied will be mainly described in order to prevent the essence of the disclosure from being obscure and to prevent the description from becoming complicated. In example of FIGS. 11 to 13, the construction of the pixel region other than the photo sensor is not limited to the illustrated example, and all of the structures of the pixel region filed prior to the filing date of the disclosure should be understood as being included in the disclosure.

FIG. 11 is an equivalent circuit diagram showing one pixel region of a liquid crystal display device to which the photo sensor according to the embodiment of FIG. 3 is applied. FIG. 12 is a plan view showing an area R2 of the equivalent circuit diagram shown in FIG. 11, and FIG. 13 is a cross-sectional view taken along line I-I' of FIG. 12.

A liquid crystal display device having the photo sensor according to the embodiment of the disclosure includes a first substrate and a second substrate facing each other, a liquid crystal layer disposed between the first substrate and the second substrate, and a pixel array disposed on the first substrate. The pixel array includes a plurality of data lines DL and a plurality of gate lines GL crossing over each other, and a plurality of pixels arranged in a matrix form in the crossing regions. Each of the pixels includes a photo sensor PSR and display elements.

Referring to FIGS. 11 to 13, the photo sensor PSR includes a photo TFT PT, a first storage capacitor Cst1, and a first switching TFT ST1.

The photo TFT PT includes a photo source electrode PS connected to a first node n1, a photo gate electrode PG connected to a second node n2 which is connected to a gate line GL, a photo drain electrode PD connected to the second node n2 and a photo semiconductor layer A1 for converting light energy into electric energy between the photo drain electrode PD and the photo source electrode PS. The gate line GL, the photo gate electrode PG, the photo drain electrode PD, and the photo source electrode PS may be formed using a metal material having good conductivity. The photo semiconductor layer A1 may be formed using amorphous silicon (a-Si) having a large light absorption coefficient over an entire wavelength range as well as a high photoelectric conversion efficiency.

The first storage capacitor Cst1 includes a first capacitor electrode C1 is connected to the first node C1 and a second capacitor electrode C2 connected to the second node n2 which is connected to the gate line GL. The second capacitor electrode C2 is opposite to the first capacitor electrode C1 with an insulating film therebetween. The first and second capacitor electrodes C1 and C2 may be formed using a metal material having good conductivity.

The first switching TFT ST1 includes a first switching gate electrode SG1 connected to the second node n2, a first switching drain electrode SD1 connected to the first node n1, and a first switching source electrode SS1 connected to a lead-out wire RO, and a first switching semiconductor layer A2 for controlling the amount of current in accordance with a control signal supplied to the first switching gate electrode SG1 through the gate line GL between the first switching drain electrode SD1 and the first switching source electrode SS1. The first switching gate electrode SG1, the first switching drain electrode SD1, the first switching source electrode SS1, and the lead-out wire RO may be formed using a metal material having good conductivity. The first switching semiconductor layer A2 may be formed using an oxide semiconductor which can be driven at a high speed and low power as compared with amorphous silicon and can obtain high efficiency with a small area. The first switching semiconductor layer A2 may be formed using a polysilicon (p-Si) having no characteristic damage for a manufacturing process and good driving ability since the p-Si has excellent resistance to fire, water repellency, oxidation stability, low temperature stability and gas permeability.

The display element include a gate line GL and a data line DL crossing over each other, a second switching TFT ST2 connected to the gate line GL and a data line DL, a pixel electrode Px connected to the second switching TFT ST2, a common electrode COM opposite to the pixel electrode Px with an insulating layer therebetween and to which a common voltage is applied, and a second storage capacitor Cst2 formed by overlapping the pixel electrode Px with the common electrode COM.

In the liquid crystal display device according to the embodiment of the disclosure, the display elements of the pixel array may display an image by driving liquid crystals using the voltage difference between the common electrode COM to which the voltage Vcom is applied and the pixel electrode Px to which a data voltage is charged through the second switching TFT ST2, thereby adjusting a light transmission amount.

The photo TFT PT of the photo sensor PSR senses an input light to generate a current, and charges are accumulated to the first storage capacitor Cst1 by the current generated by the photo TFT PT. The accumulated charges are output to the lead-out wire RO by the switching operation of the first switching TFT ST1. That is, when an object such as a finger, a pen, or a pupil gets accessed or contacted to the photo sensor, the amount of light incident on the photo sensor is changed, and the change in the amount of light is received through the lead-out wire RO. It becomes possible to recognize the object to be accessed or contacted.

Referring to FIGS. 12 and 13, a region R2 of the liquid crystal display device of the disclosure includes the photo TFT PT of the photo sensor PSR, the first storage capacitor Cst1, and the first switching TFT ST1 and the second switching TFT ST2 of the display element.

The first switching TFT ST1 of the photo sensor PSR includes a first switching semiconductor layer A2 disposed on the substrate SUB, a first switching gate electrode SG1 disposed on a gate insulating film GI covering the first switching semiconductor layer A2 so as to overlap the first switching semiconductor layer A2, a first switching drain electrode SD1 disposed on an interlayer insulation film ILD to be connected to one end of the first switching semiconductor layer A2 exposed through a first contact hole CH1 of the interlayer insulation film ILD, and a first switching source electrode SS1 disposed on the interlayer insulation film ILD to be connected to the other end of the first switching semiconductor layer A2 exposed through the second contact hole CH2 of the interlayer insulation film ILD. The first switching source electrode SS1 may be connected to the lead-out wire RO which is connected to an external processor.

The photo TFT PT of the photo sensor PSR includes a photo gate electrode PG disposed in a photo area on the gate insulating film GI, a photo semiconductor layer Al disposed on the interlayer insulation film ILD covering the photo gate electrode PG to overlap the photo gate electrode PG, and a photo drain electrode PD disposed on the interlayer insulation film ILD having a third contact hole CH3 exposing a portion of the photo gate electrode PG, and having one end connected to the photo gate electrode PG exposed through the third contact hole CH3 and another end connected to a portion of the photo semiconductor layer A1.

The photo gate electrode PG may be integral with the first capacitor electrode C1 of the storage capacitor Cst and extend from the first capacitor electrode C1. In addition, the photo source electrode PS may be integral with the second capacitor electrode C2, and extend from the second capacitor electrode C2.

The first storage capacitor Cst 1 of the photo sensor PSR includes a first capacitor electrode C1 disposed in a capacitor area on the gate insulating film GI, and a second capacitor electrode C2 opposite to the first capacitor electrode C1 with the interlayer insulation film ILD therebetween. The first capacitor electrode C1 may be integral with the photo gate electrode PG and the gate line GL.

The second switching TFT ST2 of the display element includes a second switching semiconductor layer A3 disposed on the substrate SUB, a second switching gate electrode SG2 disposed on the gate insulating film GI covering the second switching semiconductor layer A3 so as to overlap the second switching semiconductor layer A3, a second switching drain electrode SD2 disposed on the interlayer insulation film ILD which covers the second gate electrode SG2 and has fourth and fifth contact holes CH4 and CH5 for exposing both ends of the second switching semiconductor layer A3 to be connected to one end of the second switching semiconductor layer A3 exposed through the fourth contact hole CH4, and a second switching source electrode SS2 disposed on the interlayer insulation film ILD to be connected to the other end of the second switching semiconductor layer A3 exposed through the fifth contact hole CH5.

The pixel electrode Px of the display element is disposed on the first passivation film PAS1 covering the second switching source electrode SS2 and the second drain electrode SD2, and is connected to the second switching source electrode SS2 through a sixth contact hole CH6 which penetrates through the first passivation film PAS1.

A common electrode COM having a plurality of openings is disposed on a second passivation film PAS2 covering the pixel electrode Px so as to overlap the pixel electrode Px with the second passivation film PAS2 therebetween.

According to the photoelectric sensor, and the organic light emitting display device and the liquid crystal display device having the same, the photo gate electrode PG constituting the photo TFT PT of the photo sensor and the first electrode C1 of the storage capacitor Cst are integral with the switching gate electrode SG of the switching TFT ST without being separated from the switching gate electrode SG. Accordingly, it is possible that not only the integration can be increased but also an aperture ratio of the display devices can be improved. According to the display device having the optical image sensor of this disclosure, the first printed circuit board PCB for accommodating the light source can be disposed on the same side as a second PCB on which driver circuits of the display device are mounted, so that the first PCB and the second PCB can be easily connected, thereby improving a connectivity between the first PCB and the second PCB.

Those skilled in the art will understand that the disclosure may be changed and modified in various ways without departing from the technical spirit of the disclosure through the aforementioned contents. For example, in the description of the embodiments of the disclosure, the electroluminescence display device and the liquid crystal display device are provided as examples in which the photo sensor is applied, but the disclosure is not limited thereto. The inventive teachings may be applied to display devices such as a field emission display (FED) and a plasma display panel (PDP) as well as a biometric recognition device. Accordingly, the technical scope of the disclosure is not limited to the contents described in the detailed description of the specification, but should be determined by the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
 a first thin film transistor having a first gate electrode, a first drain electrode, a first source electrode, and a first gate insulator;
 a storage capacitor having a capacitor insulator, a first capacitor electrode and a second capacitor electrode positioned to face the first capacitor electrode, the capacitor insulator positioned between the first capacitor electrode and the second capacitor electrode, and configured to store the electric energy from the first thin film transistor as charge; and
 a second thin film transistor coupled to the first capacitor electrode, the second thin film transistor having a second gate electrode, a second drain electrode, a second source electrode, and a second gate insulator;
 wherein the first gate electrode of the first thin film transistor, the first capacitor electrode of the storage capacitor and the second gate electrode of the second thin film transistor are integrally formed with each other as a single contiguous member.

2. The device of claim 1, wherein the first gate electrode of the first thin film transistor, the first capacitor electrode of the storage capacitor, the second gate electrode of the second thin film transistor are formed as a single, continuous layer.

3. The device of claim 1, wherein the first gate insulator of the first thin film transistor and the second gate insulator of the second thin film transistor having a different thickness.

4. The device of claim 3, wherein the thickness of the first gate insulator of the first thin film transistor is thicker than the thickness of the second gate insulator of the second thin film transistor.

5. The device of claim 1, wherein the first gate insulator of the first thin film transistor and the capacitor insulator of the storage capacitor are formed integrally with each other.

6. The device of claim 1 wherein the first thin film transistor is a photosensitive transistor and the second thin film transistor outputs a charge stored on the capacitor based on the light sensed by the first thin film transistor.

7. The device of claim 1 further comprising:
 a display device;
 a plurality of gate lines in the display device;
 a plurality of data lines crossing respective gate lines of the plurality of gate lines in the display device; and
 pixels disposed in regions adjacent to the crossing of the plurality of gate lines and data lines, wherein each of the pixels includes display elements configured to display an image.

8. The device of claim 1 further comprising:
 an electroluminescence display device;
 a plurality of gate lines in the electroluminescence display device;
 a plurality of data lines crossing respective gate lines of the plurality of gate lines in the electroluminescence display device; and
 pixels disposed in regions adjacent to the crossing of the plurality of gate lines and data lines, wherein each of the pixels includes:
  an organic light emitting diode; and
  a cell driving unit configured to control an amount of current flowing through the organic light emitting diode.

9. The device of claim 8, further comprising a lead-out wire connected to the second source electrode of the second thin film transistor, and overlapped with the data line.

10. The device of claim 1 further comprising:
 a liquid crystal display device;
 a plurality of gate lines in the liquid crystal display device;
 a plurality of data lines crossing respective gate lines of the plurality of gate lines in the liquid crystal display device; and pixels disposed in regions adjacent to the crossing of the plurality of gate lines and data lines, wherein each of the pixels includes:
a pixel electrode configured to receive a data voltage through a third thin film transistor connected to the gate line of the plurality and the data line of the plurality;
a common electrode configured to receive a common voltage, and opposite to the pixel electrode to generate electric field by voltage difference between the data voltage and the common voltage.

11. A method of fabricating a semiconductor structure comprising:
forming a first semiconductor layer for a first thin film transistor;
forming a second semiconductor layer for a second thin film transistor, the second semiconductor layer being spaced apart from the first semiconductor layer;
forming a first gate insulator adjacent to the first semiconductor layer;
forming a second gate insulator adjacent to the second semiconductor layer;
forming a second capacitor electrode of a storage capacitor
forming a dielectric material adjacent to the second capacitor electrode;
forming in a single process step a contiguous electrically conductive member that is positioned adjacent to the first gate insulator to act as a gate for the first thin film transistor and is positioned adjacent to the second gate insulator to act as a gate for the second thin film transistor and is positioned adjacent to the insulator to act as a first capacitor electrode of the storage capacitor, the contiguous electrically conductive member being a single integral layer.

12. The method of fabricating a semiconductor structure of claim 11,
forming the gate electrode used as the gate of the first thin film transistor, the gate of the second thin film transistor, the first capacitor electrode of the storage capacitor at the same time as a continuous layer.

13. The method of fabricating a semiconductor structure of claim 11,
forming a gate line of the semiconductor structure as a single integral layer as the gate of the first thin film transistor, the gate of the second thin film transistor , the first capacitor electrode of the storage capacitor.

14. A method of fabricating a semiconductor structure comprising:
forming a first semiconductor layer for a first thin film transistor, the first thin film transistor having a first source electrode, a first gate electrode and a first drain electrode;
forming a second semiconductor layer for a second thin film transistor, the second semiconductor layer being spaced apart from the first semiconductor layer, the second thin film transistor having a second source, gate and drain electrode;
forming a first gate insulator adjacent to the first semiconductor layer;
forming a second gate insulator adjacent to the second semiconductor layer;
forming a first capacitor electrode and a second capacitor electrode of a storage capacitor, a dielectric material being between the first capacitor electrode and the second capacitor electrode; and
forming the first source electrode of the first thin film transistor, the second capacitor electrode of the storage capacitor and the second drain electrode of the second thin film transistor as a single, contiguous, integral layer,
wherein the first gate electrode of the first thin film transistor, and the first capacitor electrode of the storage capacitor are integrally formed with each other as a single contiguous layer.

15. The method of fabricating a semiconductor structure of claim 14, wherein
the first source electrode of the first thin film transistor, the second capacitor electrode of the storage capacitor, the second drain electrode of the second thin film transistor are integrally formed at the same time as each other as a single contiguous layer.

16. The method of fabricating a semiconductor structure of claim 14, wherein the first gate electrode of the first thin film transistor, and the first capacitor electrode of the storage capacitor are formed at the same time.

* * * * *